United States Patent [19]
Tews

[11] Patent Number: 6,034,390
[45] Date of Patent: Mar. 7, 2000

[54] MULTI-BIT TRENCH CAPACITOR

[75] Inventor: Helmut Tews, Poughkeepsie, N.Y.

[73] Assignee: Infineon Technologies North America Corp., Cupertino, Calif.

[21] Appl. No.: 09/340,095

[22] Filed: Jun. 25, 1999

[51] Int. Cl.[7] ............................................... H01L 27/108
[52] U.S. Cl. .......................... 257/301; 251/296; 251/304
[58] Field of Search ..................................... 257/301, 304, 257/296; 438/243, 244

[56] References Cited

U.S. PATENT DOCUMENTS 5,909,619  6/1999  Chi ........................................... 438/244
5,920,785  7/1999  Chi et al. ................................. 438/387

*Primary Examiner*—Tom Thomas
*Assistant Examiner*—Thien F Tran
*Attorney, Agent, or Firm*—Stanton C. Braden

[57] ABSTRACT

A multi-bit trench capacitor having first and second storage nodes provided in the lower region thereof is described. The storage nodes are separated by a dielectric layer that separates the sensing voltage into upper and lower ranges corresponding to data stored in the first and second storage nodes.

14 Claims, 4 Drawing Sheets

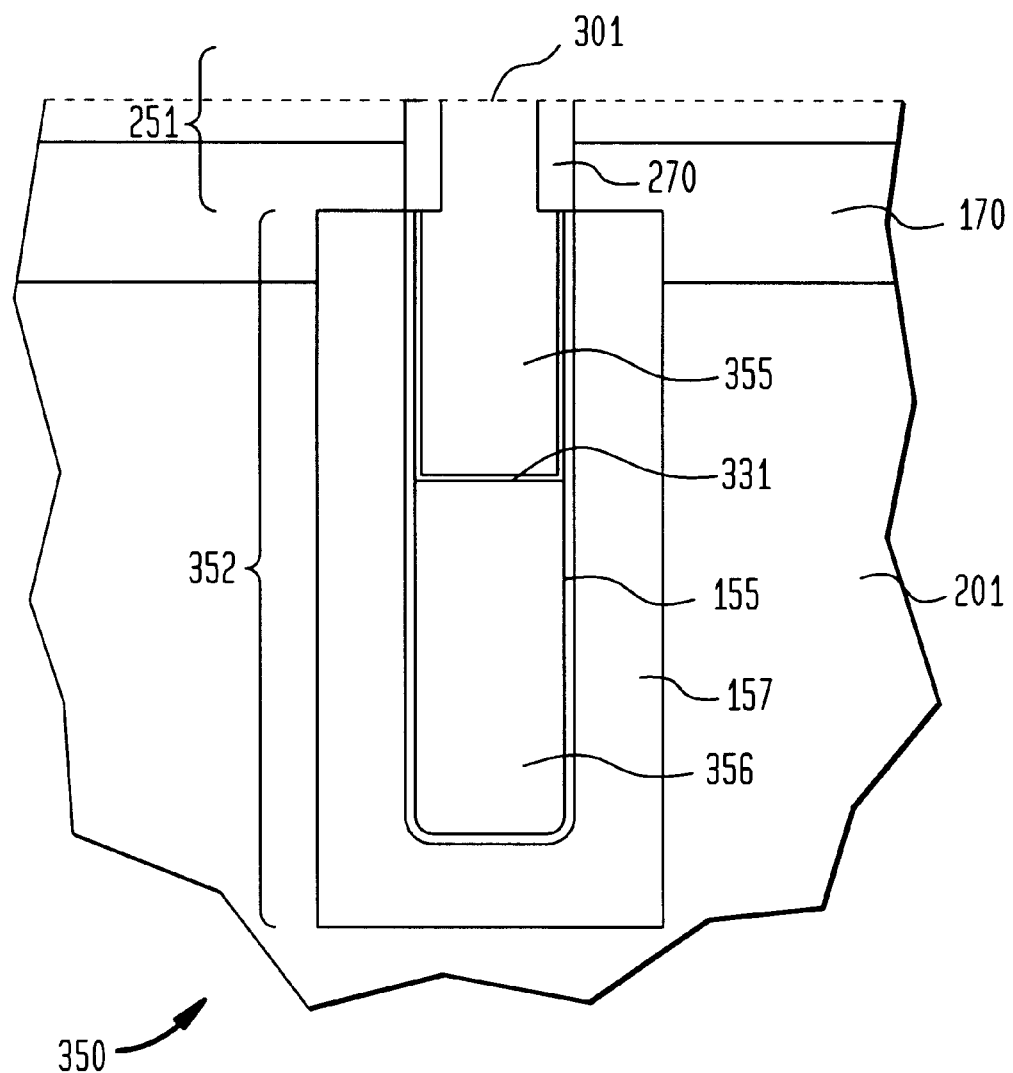

MULTI-BIT TRENCH CAPACITOR

FIELD OF THE INVENTION

The present invention relates to multi-logic trench capacitors.

BACKGROUND OF THE INVENTION

Referring to FIG. 1, a schematic of a dynamic random access memory (DRAM) cell 100 is shown. As shown, the memory cell comprises a transistor 110 and a trench capacitor 150. A first electrode 111 of the transistor is coupled to the bitline 125, and a second electrode 112 is coupled to the capacitor. A gate electrode 113 of the transistor is coupled to the wordline 126.

The trench capacitor, which is formed in the substrate, comprises first and second electrodes or plates 153 and 157 separated by a dielectric layer 155. The first plate 153 is coupled to the second electrode of the transistor. The first plate serves as a storage node for storing information.

A plurality of cells is arranged in rows and columns, connected by wordlines in the row direction and bitlines in the column direction. The second plate can be coupled to a constant voltage source 170 and serves as a common plate for the cells in the array.

A demand for higher integration resulted in a need to fabricate memory ICs with greater number of cells while reducing their surface area, creating difficulty in the manufacturing of such ICs. It is therefore desirable to provide memory cells which are conducive for higher density while keeping the size of the IC relatively small.

SUMMARY OF THE INVENTION

The invention relates to a multi-bit trench capacitor. The trench capacitor is formed in a substrate. In a lower region of the trench capacitor are first and second storage nodes separated by a dielectric layer. The dielectric layer separates the sensing voltage into upper and lower ranges representing data stored in the first and second storage nodes. An isolation collar is provided in the upper portion of the trench capacitor.

BRIEF DESCRIPTION OF DRAWINGS

FIG. 3 shows a trench capacitor in accordance with one embodiment of the invention;

DETAILED DESCRIPTION OF THE INVENTION

The invention relates to a trench capacitor, such as those employed in memory cells of ICs. The ICs, for example, include random access memories (RAMs) such as dynamic RAMs (DRAMs), high speed DRAMs such as Rambus DRAMs and SLDRAMs, ferroelectric RAMs (FRAMs), synchronous DRAMs (SDRAMs), merged DRAM-logic chips (embedded DRAMs), or other types of memory ICs or logic ICs. In particular, the invention relates to a trench capacitor having greater than binary logic, resulting in a capacitor capable of storing more than 1 bit of information.

Figure 1:
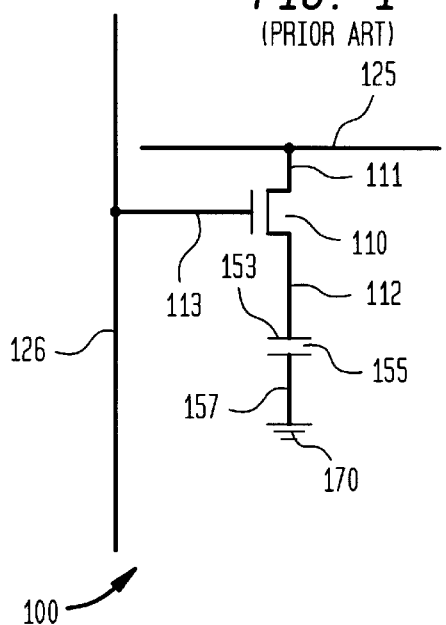
FIG. 1 shows a schematic of a conventional memory cell.
Figure 2:
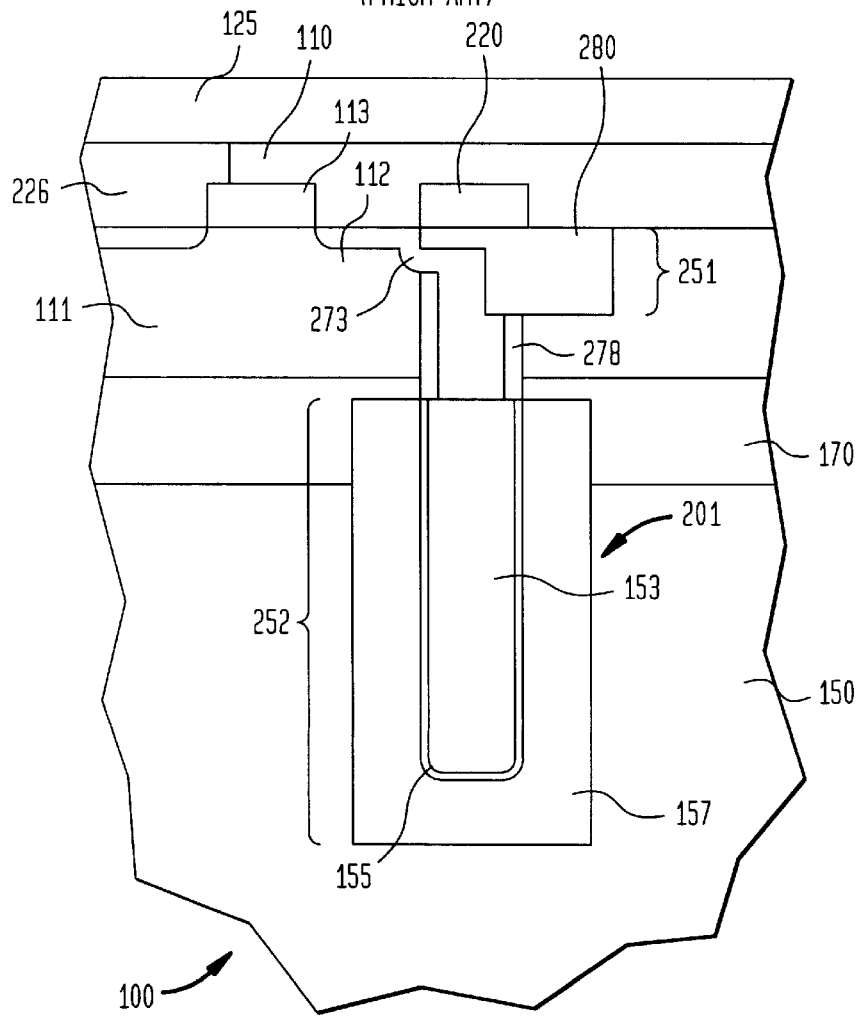
FIG. 2 shows a cross-sectional view of a conventional trench capacitor memory cell.

A cross-sectional view of conventional trench capacitor memory cell 200 is shown in FIG. 2 to facilitate understanding of the invention. Such a conventional trench capacitor memory cell is described in, for example, Nesbit et al., *A 0.6 µm$^2$ 256 Mb Trench DRAM Cell With Self-Aligned BuriEd Strap (BEST)*, IEDM 93-627, which is herein incorporated by reference for all purposes. Typically an array of such cells are interconnected by wordlines and bitlines to form a memory chip.

The DRAM cell 100 comprises a trench capacitor 150 formed in a substrate 201 such as a silicon wafer. The capacitor comprises a trench having upper and lower portions 251 and 252. The trench is filled with n-type heavily doped polysilicon (poly) 153 which serves as one plate of the capacitor. A heavily doped n-type diffusion region 157 optionally surrounds a lower portion 252 of the trench. The diffusion region serves as the second plate of the capacitor. A dielectric layer 155 separates the capacitor plates. The lower portion represents the storage node of the memory cell. The second plate can be coupled to a reference source, such as $V_{DD}/2$ ($V_{DD}$=internal chip operating voltage). A buried diffusion region 170 can be provided to commonly coupled other plates of the capacitors within the array.

An isolation collar 278 surrounds the upper portion of the trench to prevent punchthrough. A shallow trench isolation (STI) 280 is provided at the top part of the upper portion of the trench capacitor. The STI isolates the capacitor for other components in the IC, such as other capacitors. The use of field oxides for isolation from other components of the IC is also useful.

The memory cell also comprises a transistor 110 having source/drain diffusion regions 111 and 112 and a gate 113. The source/drain diffusion regions comprise, for example, n-type dopants. The gate is coupled to a wordline (not shown) and diffusion region 111 is coupled to a bitline 125 via contact 226. The diffusion region 112 is electrically coupled to the capacitor through a strap 273. As shown, the strap is a buried strap. Other types of straps, such as a surface strap, are also useful for connecting the transistor to the capacitor. A transistor 220 can be formed over the STI above the trench, serving as a passing wordline (i.e., not coupled to the memory cell). Such a configuration is referred to as a folded-bitline architecture. Other types of bitline architectures are also useful.

Generally, access to the memory cell is achieved by applying an appropriate voltage at the wordline to render the transistor conductive, creating an electrical path between the storage node and bitline. Data, represented by a charge, is transferred between the bitline and the storage node. Data flows from the bitline to the storage node for a write operation and in the reverse direction for a read operation.

FIG. 3 shows a cross-sectional view of a trench capacitor 350 in accordance with one embodiment of the invention. The trench capacitor comprises a trench 301 formed in a semiconductor substrate 201. The trench comprises upper and lower portions 251 and 352. To simplify discussion of the invention, the top part of the upper portion of the trench is omitted since the upper portion is essentially the same as conventional trench capacitors. The upper portion, as shown, comprises an isolation collar 270 to prevent punchthrough.

In the lower portion 352, a doped diffusion region 157 optionally surrounds the trench. The diffusion region, which for example comprises n-type dopants, serves as a plate (buried plate) of the capacitor. Typically, the diffusion region is coupled to a reference voltage source such as $V_{DD}/2$.

Other reference voltage levels are also useful. A buried diffusion region 170 can be provided to commonly coupled the buried plates of the memory cells within the array.

The trench is filled with n-type heavily doped polysilicon (poly). The doped poly can be referred to as the inner plate of the capacitor. A node dielectric layer 155 separates the buried plate form the inner plate of the capacitor. The inner plate in the lower portion of the trench serves for charge storage purposes.

In accordance with the invention, the inner plate in the lower portion of the trench capacitor comprises a dielectric layer 331 that separates the lower portion of the inner plate into the first and second regions 355 and 356. The first and second regions serve as charge storage regions for storing first and second bits of data in the capacitor.

In one embodiment, the first and second regions are about the same size to result in about the same capacitance. The size of the storage regions can be optimized such that both regions require refreshing at about the same time.

In one embodiment, the dielectric layer acts as a tunneling barrier to prevent charge from passing through at voltage levels below a specified voltage and becomes conductive at voltage levels above the specified voltage. The specified voltage depends on the memory IC's sensing voltage range. In one embodiment, the specified voltage comprises a voltage level within the sensing voltage range. Typically, the specified voltage is at the midpoint of the IC's operating range. For example, the specified voltage is about 1V for an IC with a sensing voltage range of about 2V.

In one embodiment, the dielectric layer is relatively thin to render it conductive at voltages above the specified voltage. The thickness of the dielectric layer, for example, is less than 2 nm for a specified voltage of about 2V. The thickness can be adjusted to take into account the value of the specified voltage and quality of dielectric material.

The specified voltage separates the sensing voltage range into upper and lower sensing ranges. The dielectric layer causes voltages in the upper sensing range to be stored in lower storage region 356 and the voltages in the lower sensing range to be stored in the upper storage region 355. Thus, the upper sensing range serves as a first sensing voltage range for the lower storage region while the lower sensing range serves as a second sensing voltage range for the upper storage region. The first and second voltage ranges comprise logic 0 and 1 levels to indicate the value stored in the respective first and second storage regions. For a capacitor with first and second storage regions, the sensing voltage range is divided into four logic levels to represent two bits of information stored in the capacitor.

Accessing the memory cells comprises first and second cycles for accessing the first and second storage regions. In one embodiment, the first cycle accesses the upper storage region using voltages in the lower sensing range. The second cycle accesses the lower storage region using voltages in the upper sensing range. For example, the first cycle reads the voltage from the upper storage region. The dielectric layer blocks the voltage from the lower storage region from being sensed. In the next cycle, the charge stored the lower storage region is sensed since the dielectric layer is conductive at the higher voltages. Writing and refresh operations can be performed in two cycles, similar to the read operation.

In another embodiment, the capacitor is separated into n-storage regions by using n−1 dielectric layers to represent n number of bits of information stored. In such a cause, the sensing voltage range is separated into 2n logic levels to accommodate the n number of bits stored in the capacitor.

The ability to store multiple bits increases the storage capacity of memory ICs without increasing surface area.

Figure 4A:
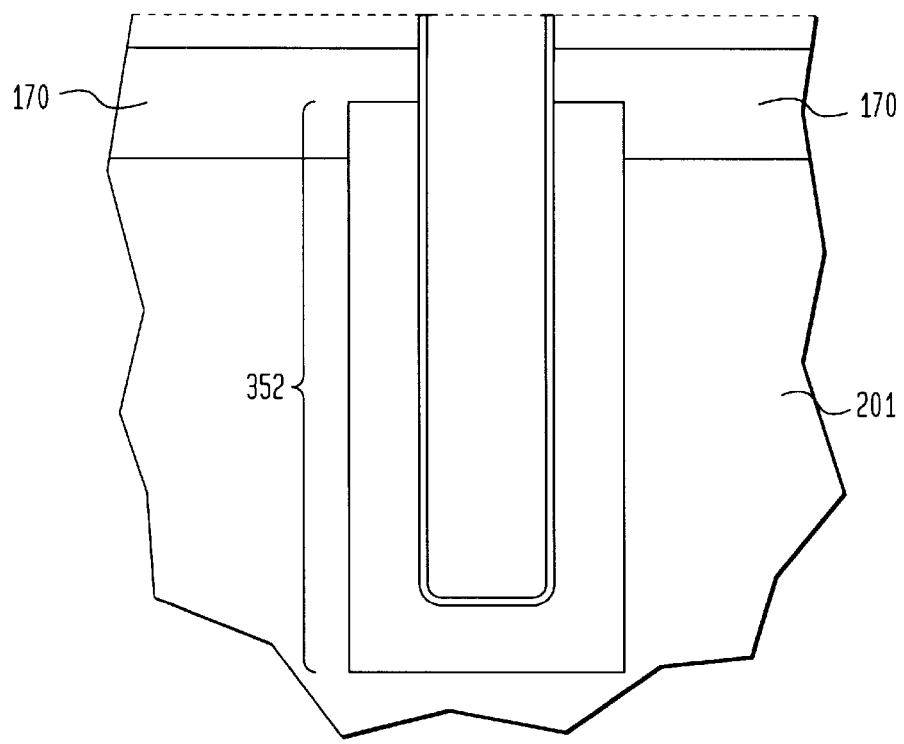
FIGS. 4a–b show a process for making a trench capacitor in accordance with one embodiment of the invention.
Figure 4B:
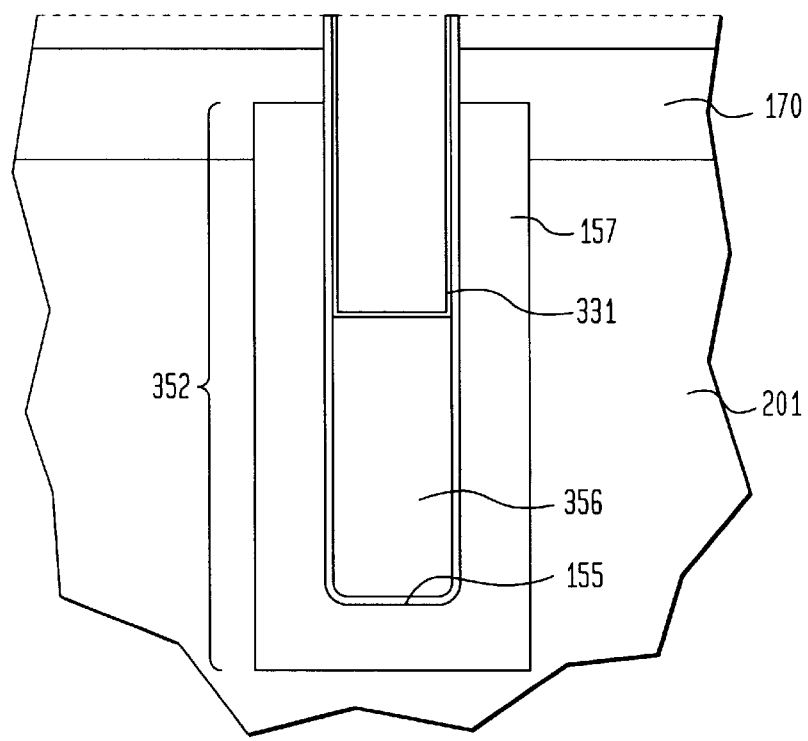

FIGS. 4a–4b show a process for fabricating a capacitor in accordance with one embodiment of the invention. Referring to FIG. 4a, a substrate 201 is provided. The semiconductor substrate, for example, comprises a silicon wafer. Other semiconductor subtrates, such as gallium arsenide or silicon-on-insulator (SOI) can also be used. In one embodiment, the substrate is lightly doped p-type substrate. Heavily doped p-type substrates or substrates doped with n-type dopants are also useful. The substrate can include a buried diffusion region 170 in the array region of the substrate. The buried diffusion region comprises, for example, n-type dopants and is used to commonly connect the outer plate of the capacitors in the array to a reference voltage source.

A trench 301 is etched in the substrate by an anisotropic etch such as reactive ion etching (RIE). A pad stack (not shown) is provided on the surface of the substrate. The pad stack comprises various layers that facilitate processing of the trench capacitor, such as etchs stop and hard etch mask layers. In one embodiment, the pad stack comprises pad oxide, pad nitride, and oxide hard mask layers.

A diffusion region 157 is optionally provided in the substrate surrounding the lower portion of the trench, serving as the outer plate of the capacitor. The diffusion region comprises, for example, n-type dopants. The outer plate is formed by conventional techniques, such as lining the trench sidewalls in the lower portion with a dopant source and outdiffusing the dopants therefrom. The dopant source comprises doped silicate glass such as arsenic doped silicate glass. Other techniques for forming the outer plate are also useful. Techniques for forming the outer plate are described in, for example, co-pending U.S. patent application U.S. Ser. No. 09/105,580 titled "A Trench Capacitor with Epi Buried Layer" (Attorney Docket Number 98P7492US02), which is herein incorporated by reference for all purposes.

The dopant source is removed and the trench sidewalls are cleaned, if necessary. A node dielectric layer is formed on the trench sidewalls. The node dielectric layer 155 comprises, for example, oxide. A composite node dielectric comprising oxide and nitride is also useful. Various techniques, such as thermal oxidation or chemical vapor deposition, can be used to form the node dielectric. Typically, the node dielectric is about 4 nm thick.

Referring to FIG. 4b, the trench is filled with, for example, heavily doped n-type poly. The poly is recessed by, for example, RIE, to the height of the lower storage region 356. The RIE is selective to oxide, removing the poly while leaving the oxide substantially unaffected. A dielectric layer 331 is formed in the trench. The dielectric layer covers the sidewalls of the trench and the top of the lower storage region.

In one embodiment, the dielectric layer comprises silicon oxide. Silicon nitride, an oxide/nitride composite or other dielectric materials are also useful. The dielectric layer is formed by, for example, thermal oxidation. Other techniques such as CVD can also be used, The thickness of the dielectric layer is about 2 nm equivalent oxide thickness. Of course the thickness can be varied depending on for example the operating voltages.

The process continues by depositing a doped poly layer over the substrate, filling the trench. The poly comprises, for example, n-type dopants. An etch, such as a RIE, recesses the poly is recessed to the top of the lower portion of the trench, forming the upper storage region. An etch can also recess the node dielectric and portions of the dielectric layer on the trench sidewalls to the height of the poly.

Subsequently, a collar is formed on the sidewalls in the upper portion of the trench. The collar comprises, for example, oxide. The collar can be formed using conventional techniques. After the collar formation, the trench is filled with doped poly, resulting in the structure as shown in FIG. 3. The process continues using conventional processes to complete the formation of top part of trench capacitor and the IC. Such processes includes, for example, forming isolation region and strap (buried or surface), the transistor, bitlines, wordlines, passivation, and packaging.

Figure 5A:
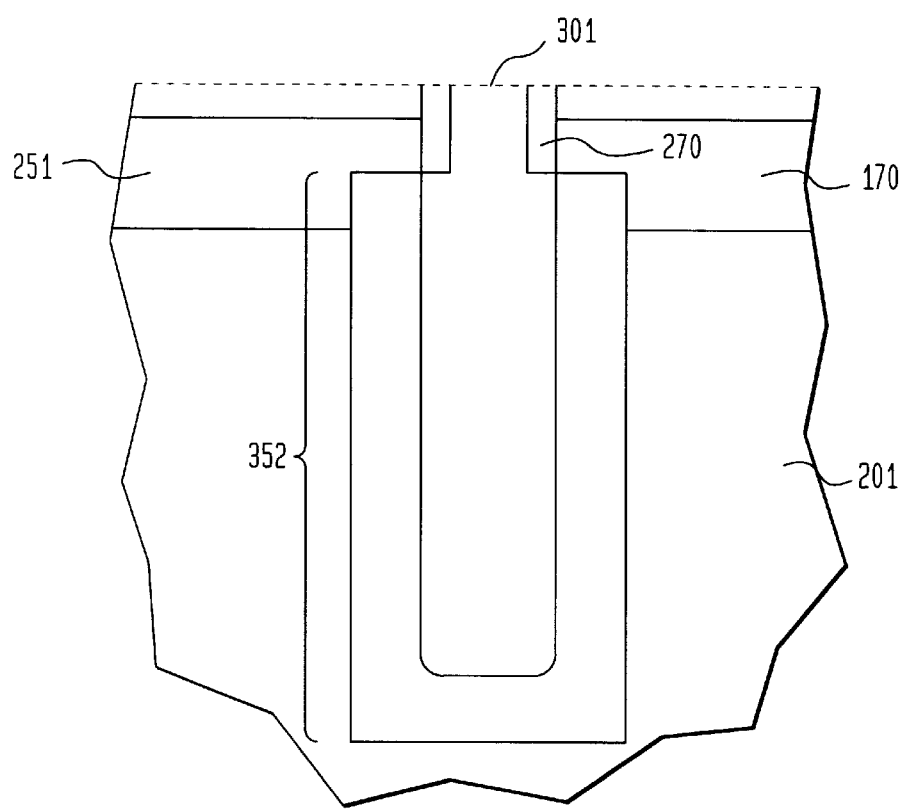
FIGS. 5a–b show a process for making a trench capacitor in accordance with another embodiment of the invention.
Figure 5B:
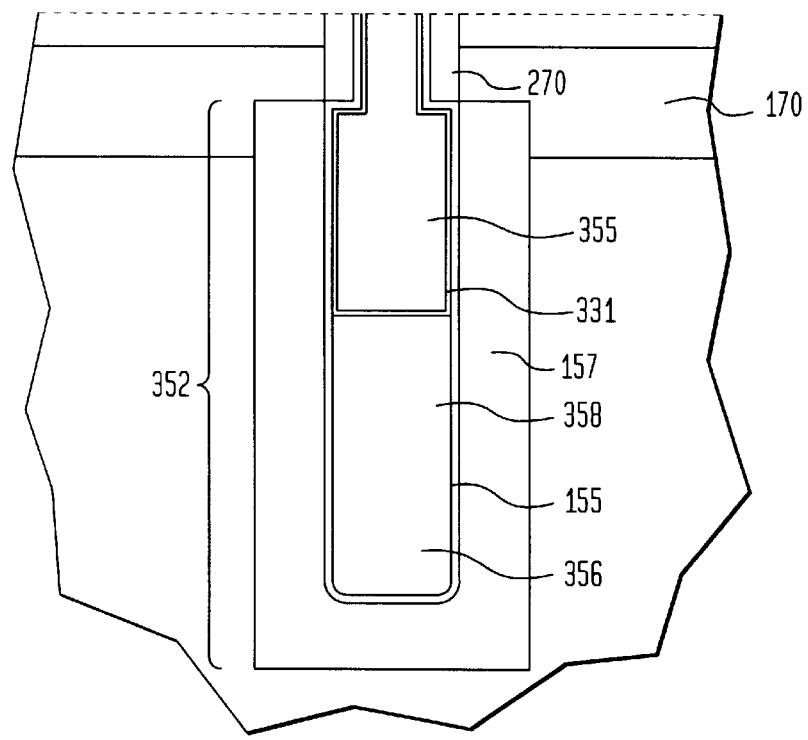

FIGS. 5a–b show an alternative process for forming the trench capacitor in accordance with one embodiment of the invention. As shown, a trench 301 is formed in a substrate 201. The trench includes a collar 270 formed on the sidewalls in the upper portion 251 of the trench and a diffusion region 157 in the substrate surrounding the lower portion 352 of the trench. The formation of collar and diffusion region, as shown, is described in, for example, co-pending U.S. patent application U.S. Ser. No. 09/055,506 titled "A Trench Capacitor with Isolation Collar" (Attorney Docket Number 98P7491US), which is herein incorporated by reference for all purposes. A buried diffusion region 170 can be provided to commonly connect the outer plate of the capacitors in the array to a reference voltage source.

Referring to FIG. 5b, a node dielectric 155 is deposited, covering the collar and sidewalls of the trench. A doped polysilicon layer is deposited by, for example, CVD to fill the trench. The doped poly is recessed by RIE to the height of the lower storage region 356. A dielectric layer 331 is then formed, covering the sidewalls of the trench and top of the poly. Another doped poly layer is deposited to fill the trench. The doped poly serves as the second storage region 355. Thereafter, conventional processing is used to complete the trench capacitor and the IC.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A multi-bit trench capacitor comprising:
    a trench in a substrate, the trench having upper and lower portions;
    a node dielectric layer on sidewalls of the lower portion of the trench;
    a dielectric layer separating the lower portion into a first storage portion and a second storage portion above the first storage portion.

2. The multi-bit trench capacitor of claim 1 further comprises a transistor coupled to the multi-bit trench capacitor to form a memory cell.

3. The multi-bit trench capacitor of claim 1 further comprises an isolation collar on sidewalls of the upper portion of the trench.

4. The multi-bit trench capacitor of claim 3 further comprises an outer plate surrounding the lower portion of the trench.

5. The multi-bit trench capacitor of claim 4 wherein the outer plate comprises a diffusion region doped with dopants.

6. The multi-bit trench capacitor of claim 2 further comprises an isolation collar on sidewalls of the upper portion of the trench.

7. The multi-bit trench capacitor of claim 6 further comprises an outer plate surrounding the lower portion of the trench.

8. The multi-bit trench capacitor of claim 1 wherein the dielectric layer is conductive at a voltage greater or equal to about a specified voltage.

9. The multi-bit trench capacitor of claim 8 wherein the specified voltage separates a sensing voltage into upper and lower sensing voltage ranges, the upper sensing voltage range is a sensing range for the first storage portion and the lower sensing voltage range is the sensing range for the second storage portion.

10. The multi-bit trench capacitor of claim 9 wherein the upper and lower sensing voltage ranges are further subdivided in logic 1 and 0 voltage levels to represent data stored in the storage portions.

11. The multi-bit trench capacitor of claim 10 wherein the specified voltage is about ½ the sensing voltage.

12. The multi-bit trench capacitor of claim 8 wherein the specified voltage is about ½ the sensing voltage.

13. The multi-bit trench capacitor of claim 9 wherein the specified voltage is about ½ the sensing voltage.

14. The multi-bit trench capacitor of claim 10 wherein the specified voltage is about ½ the sensing voltage.

* * * * *